(12) United States Patent
Alcoe

(10) Patent No.: US 6,815,837 B2
(45) Date of Patent: Nov. 9, 2004

(54) ELECTRONIC PACKAGE WITH STRENGTHENED CONDUCTIVE PAD

(75) Inventor: David Alcoe, Vestal, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 76 days.

(21) Appl. No.: 10/423,877

(22) Filed: Apr. 28, 2003

(65) Prior Publication Data

US 2004/0183212 A1 Sep. 23, 2004

Related U.S. Application Data

(63) Continuation-in-part of application No. 10/392,617, filed on Mar. 20, 2003.

(51) Int. Cl.$^7$ ................................................ H01L 23/48
(52) U.S. Cl. ........................ 257/786; 257/783; 257/784
(58) Field of Search .............................. 257/780, 783, 257/784, 786

(56) References Cited

U.S. PATENT DOCUMENTS

| | | | |
|---|---|---|---|
| 5,764,485 A | | 6/1998 | Lebaschi |
| 5,875,102 A | | 2/1999 | Barrow |
| 5,891,606 A | | 4/1999 | Brown |
| 6,091,155 A | | 7/2000 | Jonaidi |
| 6,342,682 B1 | | 1/2002 | Mori et al. |
| 6,577,017 B1 | * | 6/2003 | Wong .......................... 257/786 |
| 6,608,388 B2 | * | 8/2003 | Lin et al. ..................... 257/783 |

OTHER PUBLICATIONS

Printed Circuit Fabrication, vol. 20, No. 11, Nov., 1997, p. 42, 44, 46, 48 A New Approach . . . .
Circuits Assembly, vol. 6, No. 2, Feb., 1995, p. 42, 44, 45, 46, 50 "Vias In Pads".
IBM TDB vol. 26, No. 10B, Mar., 1984, p. 5736, "Stress Relief Printed Circuit Wiring".
IBM TDB vol. 29, No. 8, Jan., 1987, pp. 3522–3525, "Pin Attachment System For Glass Ceramic".
FI884-0345, "Localized Compressive Layer Strength Enhancement In Multilayer Glass–Ceramic Substrates With The Use of Screening".
EN899–0022, "Design For Surface Mount Technology Pin Assembly".
IBM TDB, vol. 36, No. 12, 12/93, "Solder Ball Connection Engineering Change/Wire Add Rework Concepts".
IBM Infogate, "A Reliability Assessment of Footprint Effects and Substrate Variables on Large C4 Arrays".
Austin Technical Report, Phase I SBC Reliability Factorial Experiment Results And Discussion.

* cited by examiner

*Primary Examiner*—Roy Potter
(74) *Attorney, Agent, or Firm*—Lawrence R. Fraley; Hinman, Howard & Kattell, LLP

(57) ABSTRACT

An electronic package and information handling system utilizing same wherein the package substrate includes an internally conductive layer coupled to an external pad and of a size sufficiently large enough to substantially prevent cracking, separation, etc. of the pad when the pad is subjected to a tensile pressure of about 1.4 grams per square mil or greater.

17 Claims, 14 Drawing Sheets

ELECTRONIC PACKAGE WITH STRENGTHENED CONDUCTIVE PAD

CROSS-REFERENCE TO CO-PENDING APPLICATION

This application is a continuation-in-part of Ser. No. 10/392,617, filed Mar. 20, 2003 and entitled "Chip Carrier With Optimized Circuitization Pattern", inventors: D. Alcoe et al,.

TECHNICAL FIELD

The present invention relates, in general, to electronic packages, one example being a chip carrier having a circuitized substrate for interconnecting a semiconductor chip to a printed circuit board. In particular, the invention relates to such circuitized substrate packages and the like for use in information handling systems (e.g., computers).

BACKGROUND OF THE INVENTION

Circuitized substrates, such as those used in electronic packages, have been and continue to be developed for many applications. Such a circuitized substrate usually includes a surface for redistributing electrical signals from the chip mounted on the circuitized substrate onto a larger circuitized area so that the circuitized substrate can properly interface with the hosting printed circuit board having said larger area.

With semiconductor chip input/output (I/O) counts increasing beyond the capability of peripheral lead devices and as the need for both semiconductor chip and printed circuit board miniaturization increases, area array interconnects will be the preferred method for making a large number of connections between an electronic package such as a chip carrier and a printed circuit board, For circuitized organic substrates, including chip carriers and printed circuit boards, it is known that the materials making up these substrates have some structural flexibility. All flexible materials have some limitations on the amount of mechanical strain which can be tolerated until the material fractures and fails. A measure of this is commonly known as ductility. During manufacture of an electronic package and its assembly to a printed circuit board, many sources of package substrate (laminate) and printed circuit board flexure or bending exist. Sources include manual handling through assembly, placing the printed circuit board into tooling fixtures, assembling other components onto the printed circuit board, assembly of cables and hardware to the printed circuit board and use of pressure-probes for electrical testing. Furthermore, if the coefficient of thermal expansion (CTE) of the semiconductor chip, the package's laminate substrate, and the printed circuit board are substantially different from one another, temperature changes during operation of the electronic package can cause flexure or bending of the organic structures by different amounts. As a result, industry standard ball grid array (BGA) interconnections between the package and printed circuit board may be subject to high stress. These high stresses can be transmitted into the package and can potentially cause high strain on the package's materials beyond the limits of the material ductility, and cause package damage. Significant yield loss concerns during manufacturing, and reliability concerns during thermal cycling field operation may become manifest by failure (cracking or delamination) of dielectrics and circuitry on or within the chip carrier or even failure of the integrity of the semiconductor chip (chip cracking) caused by high stress during manufacturing and field operation. These concerns significantly inhibit design flexibility. For example, semiconductor chip sizes may be limited or interconnect sizes, shapes and spacing may have to be customized outside or beyond industry standards to reduce these stresses. These limitations may limit the electrical performance advantages of the electronic package and/or add significant cost to the electronic package.

One particular yield and reliability concern is that of the circuitized substrate's external conductive layer, which is used to electrically bond the package to the printed circuit board, with the aforementioned solder ball grid array. This layer may be susceptible to stresses transmitted from the printed circuit through the BGA solder ball interconnections from handling or thermal cycling of the electronic package. If the layer (and an accompanying solder mask layer if utilized) cannot accommodate the stresses, then it is susceptible to deterioration, such as cracking or partial separation, which can cause failure of the formed connection (and the electronic package). Even worse, such failure may also cause failure of the information handling system utilizing the package. By the term information handling system as used herein is meant any instrumentality or aggregate of instrumentalities primarily designed to computer, classify, process, transmit, receive, retrieve, originate, switch, store, display, manifest, measure, detect, record, reproduce, handle or utilize any form of information, intelligence or data for business, scientific, control or other purposes. Examples include personal computers and larger processors such as servers, mainframes, etc.

High stresses transmitted to the upper layer(s) of such a package substrate will typically occur at the edges of the BGA interconnection pads and will be highest at the edges of the BGA interconnection pads under the rows of BGA solder ball interconnections at or near a corner of the package's usually rectangular substrate. To a lesser extent, high stresses transmitted to this layer can also occur at the edges of the BGA interconnection pads under the rows of BGA solder ball interconnections at or near the non corner edges of the chip carrier. Cracks in or separation of the conductive layer caused by the flexure, described above, generally initiate in these areas of highest stress. Solutions to this problem which limit or reduce the amount of printed circuit board flexure can be impractical and overly restrictive.

Thus, it is desirable to have an electronic package with a laminate, circuitized substrate that substantially inhibits or prevents separation and/or cracking of the external circuit pattern during flexure of the package caused by assembly, handling or operation. The package (and system) defined herein will have improved yield and increased field life operation, and thus represent an advancement in the art.

OBJECTS AND SUMMARY OF THE INVENTION

Accordingly, it is the object of this invention to enhance the art of electronic packaging and of information handling systems utilizing same.

It is another object of the invention to provide an electronic package that includes a circuitized substrate that can be manufactured in such a manner that substantially inhibits or prevents cracking or separation of a circuit pattern (e.g., pad) positioned on the surface of the package's circuitized substrate, has increased yields, and can be produced at relatively competitive costs compared to many current products.

It is still another object of the invention to provide an information handling system utilizing such an electronic package mounted on a suitable substrate such as a printed circuit board which in turn is positioned in the system.

According to one aspect of the invention, there is provided an electronic package comprising a substrate having an external surface, an electrically conductive pad positioned on the external surface, and at least one electrically conductive layer positioned within the substrate and physically coupled to the electrically conductive pad, the at least one electrically conductive layer of a size sufficiently large enough to substantially prevent removal of the electrically conductive pad when the pad is subjected to a tensile pressure of at least about 1.4 grams per square mil.

According to another aspect of the invention, there is provided an information handling system comprising at least one printed circuit board including at least one electrically conductive receptor thereon, an electronic package including a substrate having an external surface, an electrically conductive pad positioned on the external surface, and at least one electrically conductive layer positioned within the substrate and physically coupled to the electrically conductive pad. The at least one electrically conductive layer is of a size sufficiently large enough to substantially prevent removal of the electrically conductive pad when the pad is subjected to a tensile pressure of at least about 1.4 grams per square mil. The system further includes an electrically conductive member secured to the electrically conductive pad and electrically coupled to the at least one electrically conductive receptor to connect the electronic package to the at least one printed circuit board.

The above objects, advantages and features of the present invention will become more readily apparent from the following detailed description of the presently preferred embodiments as illustrated in the accompanying drawings.

BEST MODE FOR THE CARRYING OUT THE INVENTION

For a better understanding of the present invention, together with other and further objects, advantages and capabilities thereof, reference is made to the following disclosure and appended claims in connection with the above-described drawings. It is understood that like numerals will be used to indicate like elements from FIG. to FIG.

Figure 1:
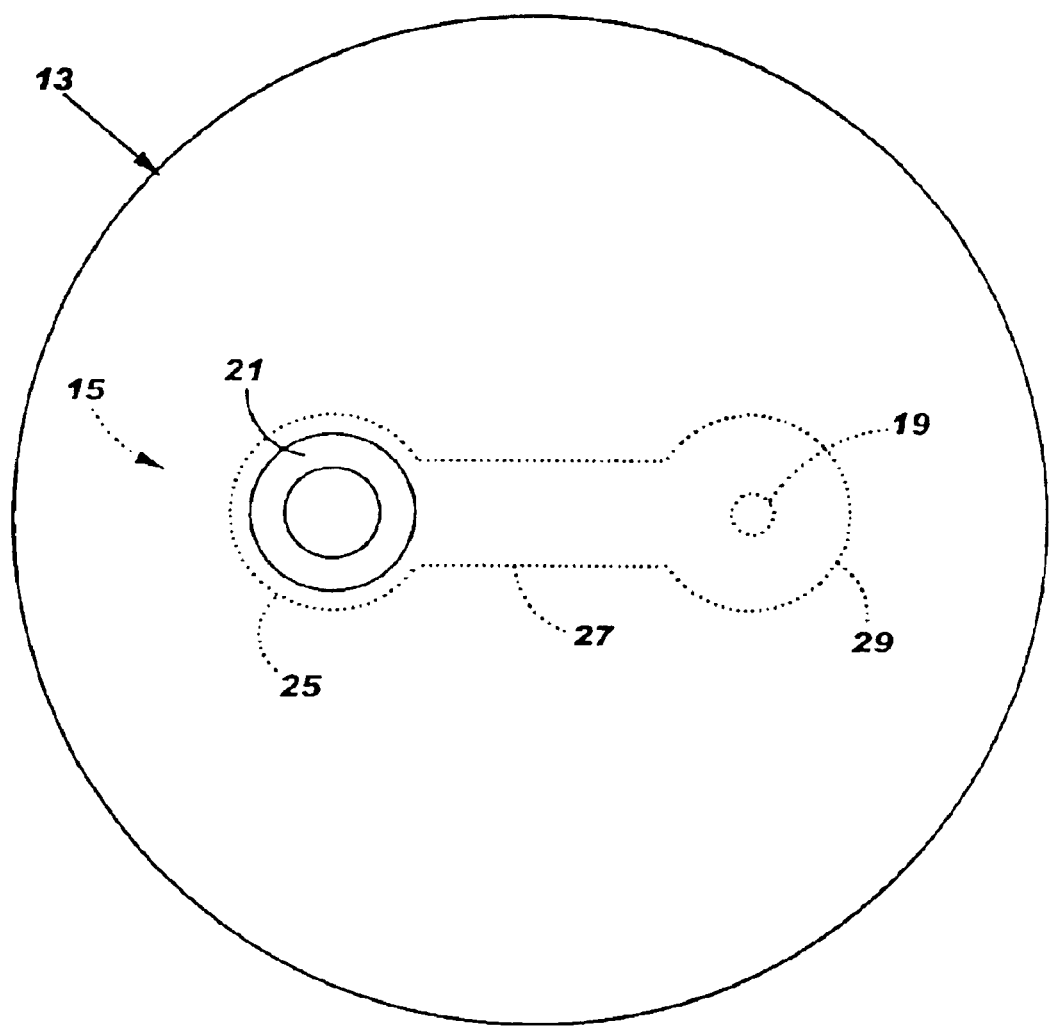
FIGS. 1 and 1A represent partial top and side elevational views of an electronic package substrate, respectively, showing the substrate's conductive pad coupled to an underlying conductive layer.
Figure 1A:
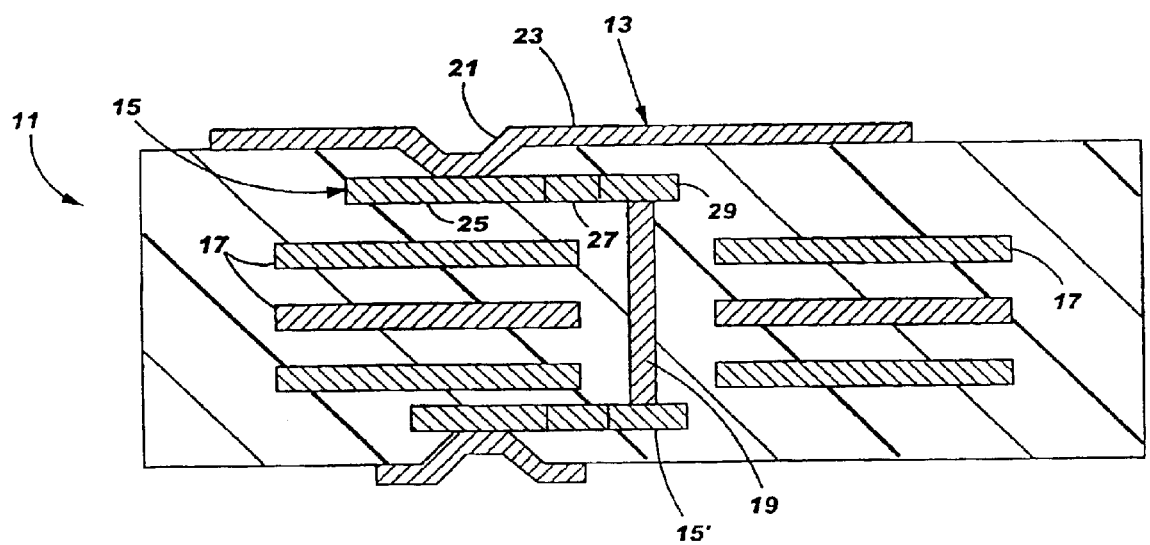

In FIGS. 1 and 1A, there is shown the circuitized substrate 11 of the electronic package described in parent application Ser. No. 10/392,617, filed Mar. 20, 2003 under attorney docket number END920020058US 1. FIG. 1 is a partial overhead plan view showing the electrically conductive pad 13 but not the underlying substrate on which this pad is positioned. Pad 13 is physically coupled to an internal conductive layer 15 as shown, which internal conductive layer may also be connected to additional conductive layers 17 and/or a vertically oriented conductive via (or through) hole 19 to be connected to these other conductive layers. In the example in FIG. 1A, layer 15 is connected using the conductive via 19 to a similar layer 15' located on the opposite surface of substrate 11. It is also possible for layer 15 to be connected to selected ones of layers 17 using the conductive via 19 by merely extending the respective conductive layers to physically connect to via 19. As seen in the overhead view of FIG. 1, conductive pad 13 of Ser. No. 10/392,617 includes an indented via portion 21 in addition to a substantially planar portion 23 located on the substrate's upper surface. The indented via portion extends through at least one layer of dielectric material which forms part of the multilayered substrate 11 to form the physical connection with underlying conductive layer 15. As specifically seen in FIG. 1, the underlying conductive layer 15 (shown hidden in FIG. 1) includes an annular portion 25 of substantially the same outer diameter as indented via 21, a relatively narrow connecting portion 27 and a second annular portion 29 which forms the electrical connection to the via 19. This structure for underlying layer 15 is referred to as a "dog-bone" configuration, as also explained in Ser. No. 10/392,617.

It is understood that substrate 11 comprises a plurality of conductive layers as shown and a corresponding plurality of individual dielectric layers, a preferred material for such dielectric layers being polyimide, fiberglass-reinforced epoxy resin (a/k/a FR4), glass-filled PTFE, or the like material. Such materials are known in the substrate art and further description is not believed necessary. It is understood that several individual dielectric layers are utilized and that the resulting substrate is formed using lamination of these layers along with the respective conductive layers. Such materials have a modulus, or stiffness, which can be effectively much lower than that of the metallic conductive layers (10–20 Mpsi) but still of sufficient stiffness (>10 ksi) to couple the metallic layers together following a lamination, curing, or joining process. In the embodiment of FIG. 1A, the illustrated conductive layers are preferably of copper or copper alloy material, but other conductive materials are acceptable. The substrate 11, being formed of polyimide or the described epoxy resin or like material is thus also referred to as an organic laminate.

Figure 2:
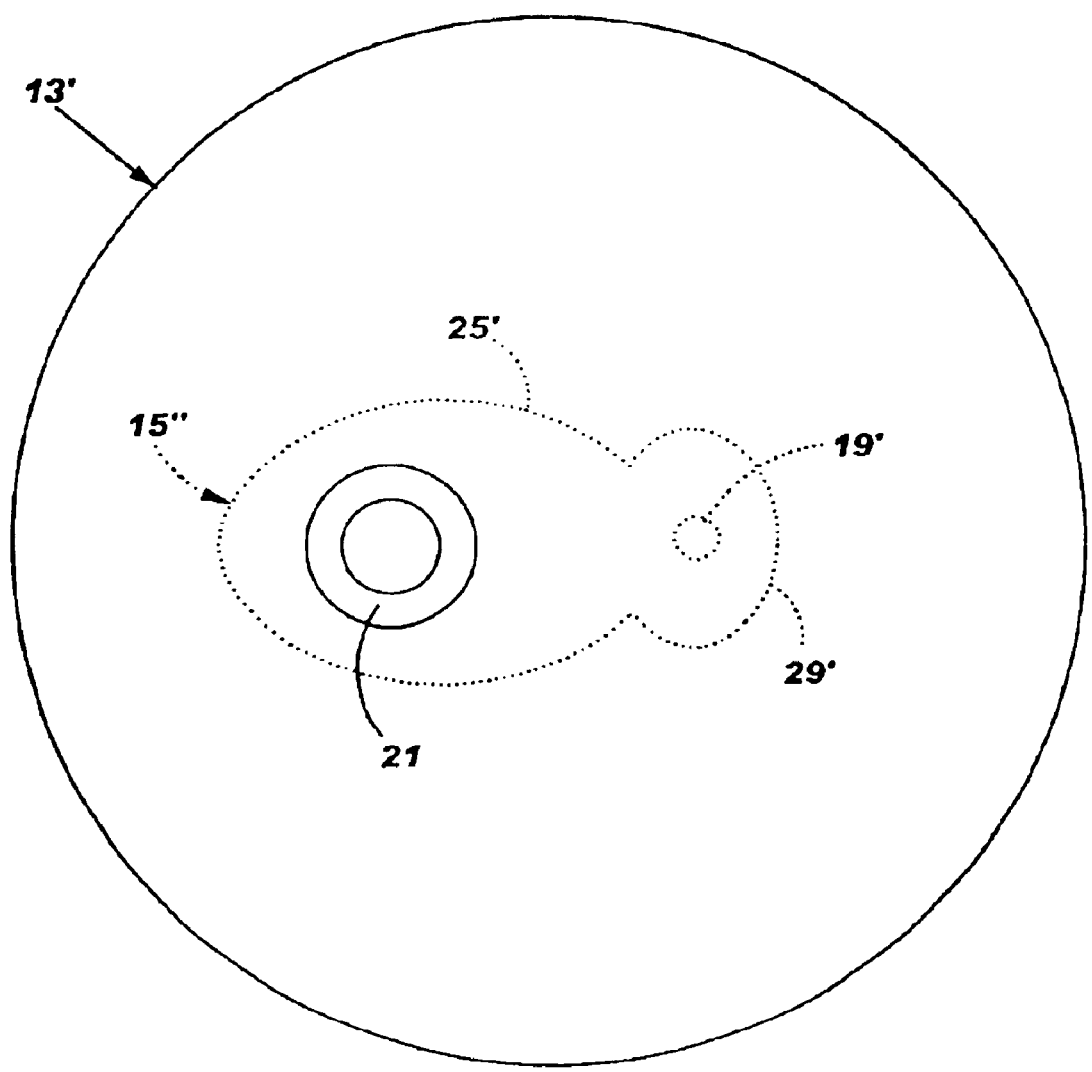
FIGS. 2 and 2A illustrate partial top and side elevational views of an electronic package substrate, respectively, according to one embodiment of the invention.
Figure 2A:
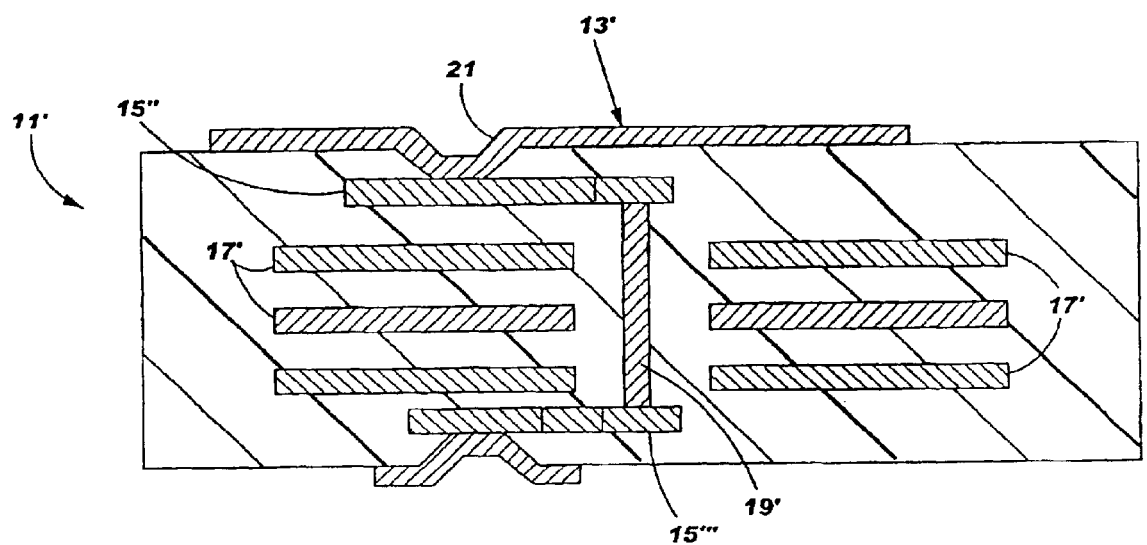

In FIGS. 2 and 2A, there is shown a circuitized substrate 11' and corresponding pad 13' according to one embodiment of the invention. Again, only pad 13' is shown in FIG. 2. In comparison to the structure in FIGS. 1 and 1A, however, substrate 11' represents a substantial improvement thereover by the provision of an underlying electrically conductive layer 15" which is of a size sufficiently large enough to substantially prevent removal of pad 13' (or partial separation thereof) when the pad is subjected to a tensile pressure of at least about 1.4 grams per square mil (a mil being 0.001 inch). For example, a pad 13' of 25 mil diameter would have 491 mil$^2$ area. Applying a load of 700 grams (a significant load, considering today's applications) over this area would result in such a pressure. Such a load and the stresses associated therewith are possible during operation of the electronic package (described below) utilizing this substrate when the pad includes an appropriate conductor (in Ser. No. 10/392,617), this is defined as a solder ball) thereon. That is, during package operation, stresses on the ball and pad and other parts of the package may cause the ball to separate or pull away from the substrate, causing cracking or partial (or even complete) separation of the pad. Such cracking or even partial separation can in turn result in an uncoupling of the indented portion 21 from the underlying layer 15, in turn resulting in the package becoming inoperable. The substrate in FIG. 2A includes remaining similar elements (i.e., internal conductive layers 17', a conductive via 19' and a corresponding opposite internal layer 15''', in addition to the aforementioned dielectric layers).

As stated, the conductive layer 15" in FIGS. 2 and 2A is sufficiently large to prevent the aforedefined pad 13' removal and/or damage. FIG. 2 illustrates an example of the relative size and corresponding shape according to one embodiment of the invention. For example, the strength of a pad 13 (FIG. 1) having a diameter of 25 mils and an annular region 25 (FIG. 1) having a diameter of 10 mils and an area of about 80 square mils can be improved using portion 25' which has an area at least two times larger, in this case exceeding 25% of the total area of pad 13, a preferred ratio for the present invention. Layer 15" in FIG. 2 is shown to include a relatively large, bulbous portion 25' directly coupled or forming a part of the corresponding annular portion 29' which couples to via 19'. Reinforced physical coupling between 15" and 13' results from stiffeness of dielectric material and co-adhesion between the pad, conductive layer and interim dielectric layer. The respective indented portion 21, as seen also in FIG. 2A, remains of substantially the same configuration as shown in FIGS. 1 and 1A. This relatively large configuration for layer 15" substantially prevents pad removal, or even partial separation, when subjected to the stresses mentioned above. As will be defined in the following description, this configuration represents only one embodiment of the invention which is capable of doing so. Significantly, this embodiment also enables the use of an electrically conductive pin (defined below) in place of the solder balls described in Ser. No. 10/392,617, in addition to the use of such a solder ball if desired. Thus, the unique configurations depicted herein are able to provide alternative means of connecting the external pad to another electronic component (e.g., a semiconductor chip or corresponding pad on a printed circuit board) while overcoming stresses associated with such connections, especially during operation of the resulting assembly, in addition to handling thereof (e.g., during shipment or manufacture).

In the embodiments defined herein, the dielectric layer immediately under the pad may comprise a solder mask material instead of one of the aforementioned other dielectric materials described above. Examples of a commercially available solder mask material than can be used in this invention include PSR-4000 (a registered trademark of Taiyo America, Inc., Carson City, Nev.) or PC5103, an allylated polyphenylene ether (APPE), manufactured by Asahi Chemical Company of Japan. Use of a solder mask is also possible for the opposite external dielectric layer should substrate 11' include a similar conductive pad on the opposite surface thereof. Such a pad is not shown herein but it is well understood that this could be readily applied on the substrate's opposite surface to provide the unique advantages taught herein for pads on both opposing surfaces.

Of significance, it is noted that the underlying conductive layer 15" in FIGS. 2 and 2A is located substantially completely beneath the larger conductor pad 13' within substrate 11'. However, that is not a requirement for the present invention as illustrated in FIGS. 3, 3A, 4 and 4A.

Figure 3:
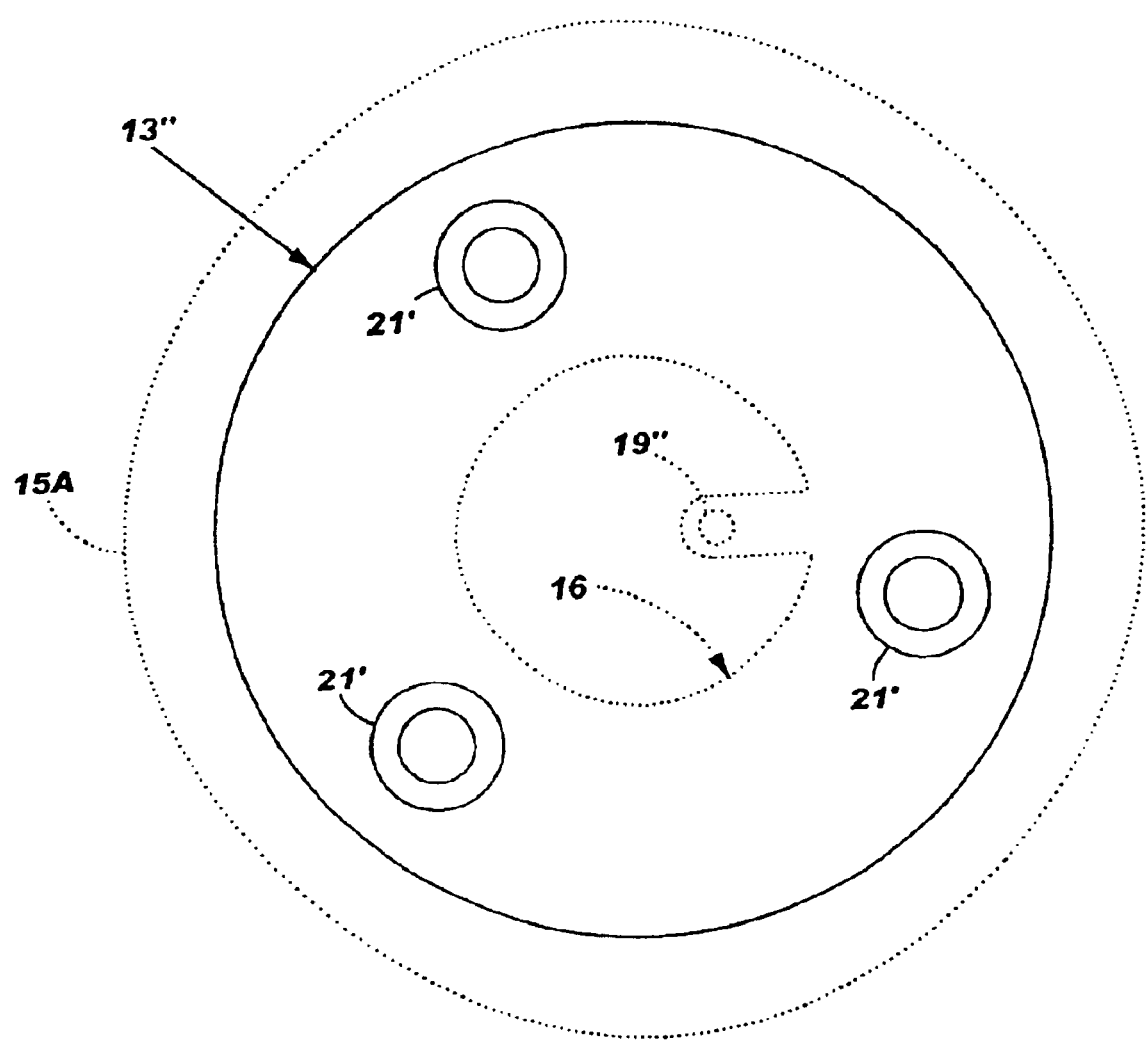
FIGS. 3 and 3A illustrate, respectively, partial top and side elevational views of another embodiment of a substrate for use with the invention.
Figure 3A:
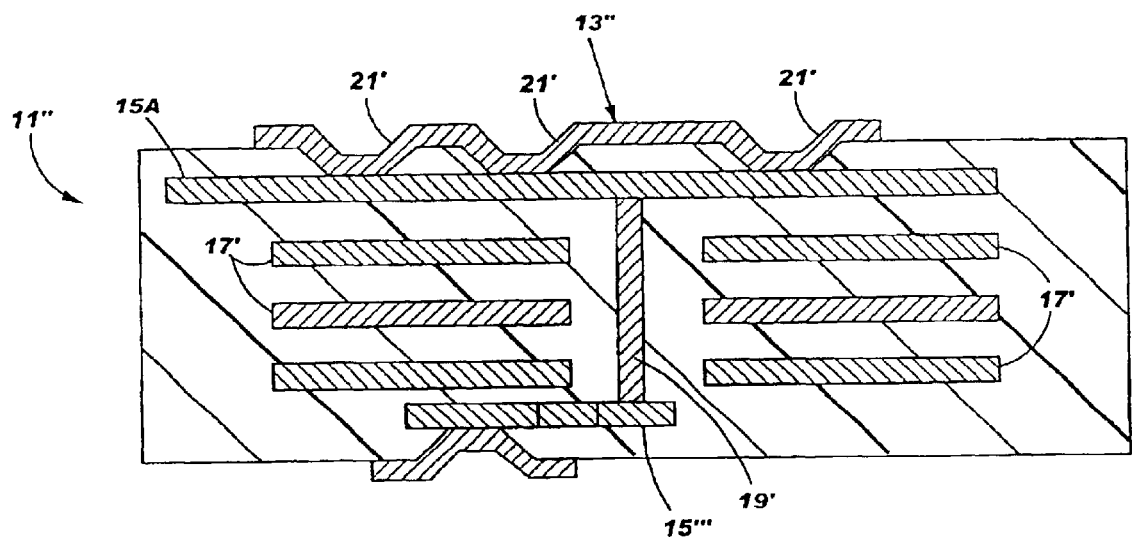

In FIGS. 3 and 3A, there is shown a circuitized substrate in accordance with an alternative embodiment of the invention. As seen, the upper conductive pad 13" includes three indented via portions 21' spaced located therein in a substantially annular orientation wherein the indented via portions are substantially uniformly spaced about the annular pattern. The underlying conductive via 19" is shown hidden in FIG. 3, as is the underlying electrically conductive layer 15A. Layer 15A is shown as being substantially annular (circular) in shape and, significantly, having a larger surface area than the overlying conductive pad 13". The substantially increased size for layer 15A, in combination with the use of multiple indented portions 21', adds further strength to the substrate 11" than in the version defined above. It is within the scope of the invention to add even more indented portions 21' than those shown for even further strength. The remaining opposing layer 15'" may be of the same configuration as that shown in FIG. 2A (and FIG. 1A) and the opposite indented via coupled thereto may be of the configuration of the top conductor pad 13' in FIG. 2A or similar to the conductor pad 13" in FIG. 3A. As also seen in FIG. 3, layer 15A can include an opening 16 substantially centrally located therein (and under pad 13") with a portion of the layer 15A coupled to via 19".

Figure 4:
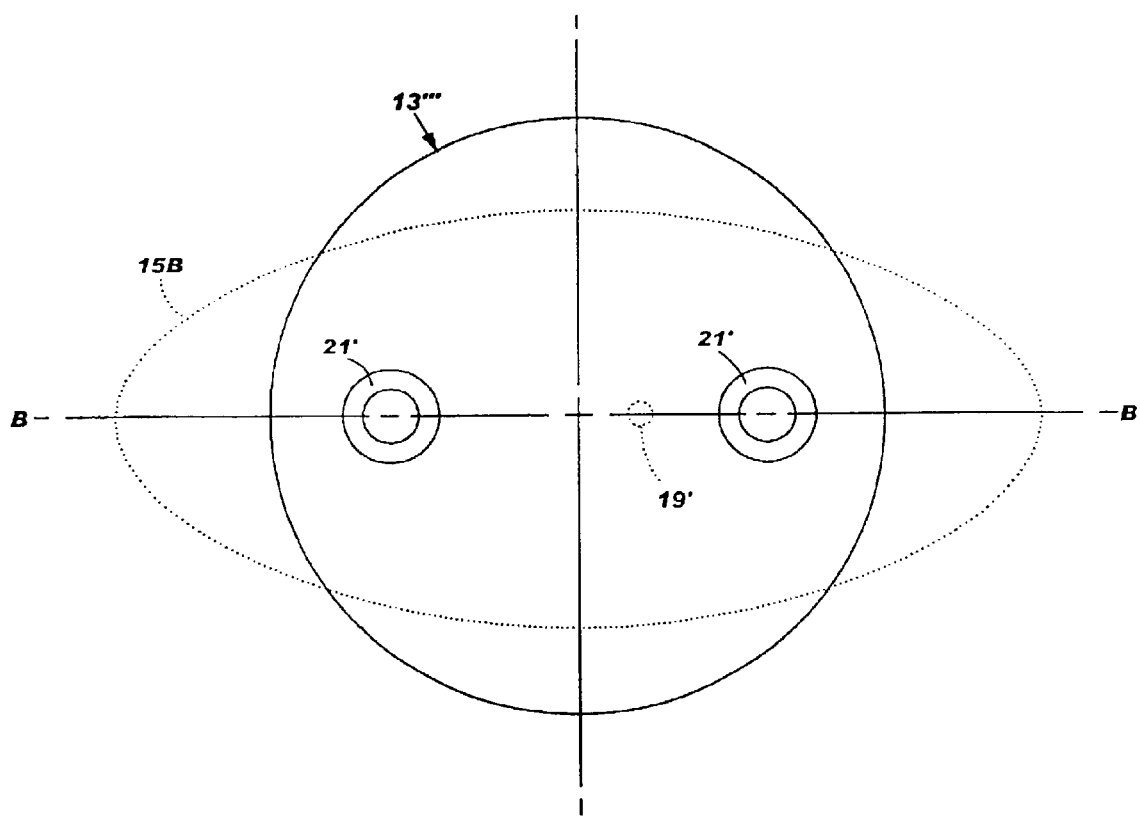
FIGS. 4 and 4A illustrate partial top and side elevational views, respectively, of still another embodiment of a substrate for use with the invention.
Figure 4A:
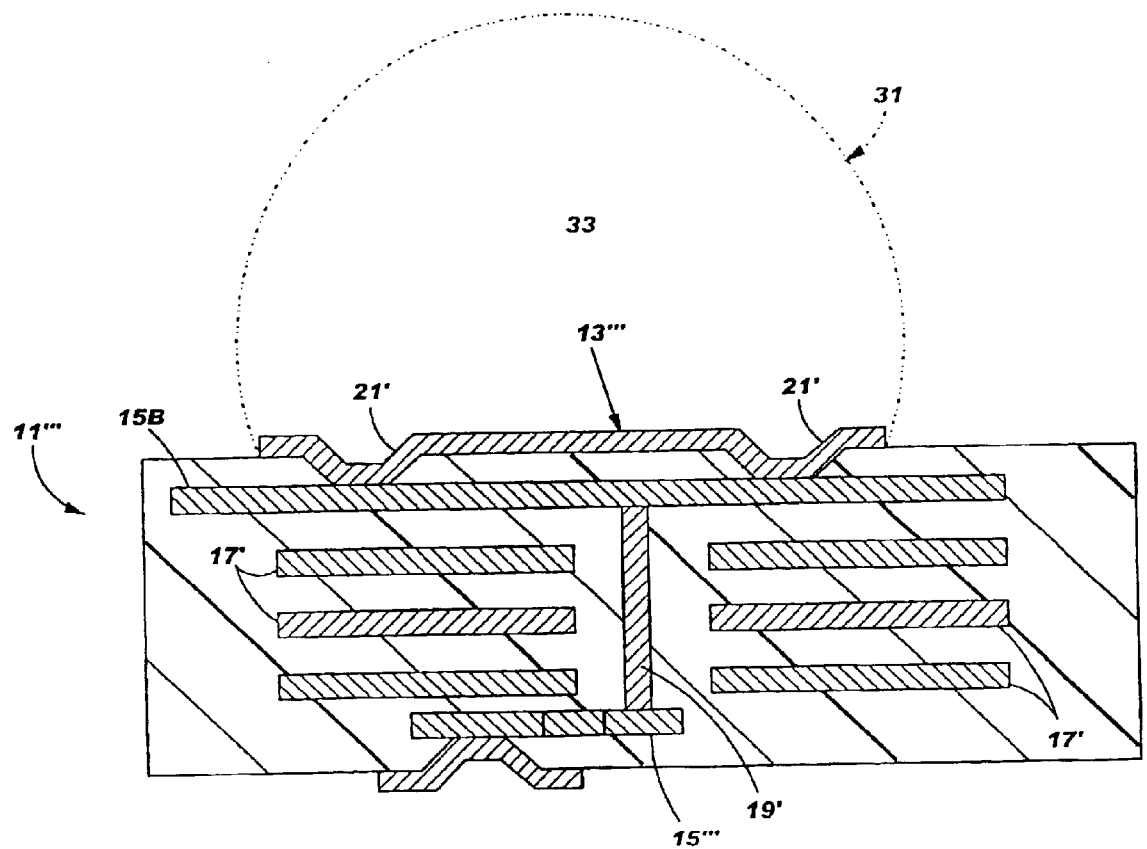

FIGS. 4 and 4A represent yet another embodiment of a circuitized substrate which can be utilized in the present invention. Substrate 11'", as shown in FIG. 4A, includes a plurality of dielectric and conductive layers therein, similar to those in the aforedefined substrates except for the immediately underlying conductive layer 15B (shown hidden in FIG. 4). Pad 13'" includes two indented portions 21' spacedly positioned within the pad but also, significantly, relative to the oblong shape of the underlying layer 15B. Specifically, these indented portions lie substantially along the axis B—B of oblong layer 15B and also along the coaxial, horizontal central axis of circular pad 13'". The protrusion of underlying layer 15B beyond the side peripheral walls of the overlying pad 13'" as seen in FIG. 4 provides the necessary added protection against pad separation or cracking, particularly at these side portions of the pad. It is also noted that the opposite underlying layer 15'" can be replaced by the above layer 15B or the underlying layers 15" and 15A as shown in FIGS. 2A and 3A above, respectively, should additional strength be needed on the opposite surface of substrate 11'". The indented via coupled thereto can also be of a configuration similar to conductors 13', 13" or 13'".

In FIG. 4A, the substrate is shown to include an electrically conductive member 31 (in phantom) which, in one embodiment, comprises a solder ball 33. As seen, ball 33 substantially covers the entire external surface of the conductive pad 13'", including the external surfaces of the indented portions 21'. Ball 33, if used, electrically couples substrate 11'" to a hosting printed circuit board.

In FIGS. 5–8, there are shown alternative embodiments of an electrically conductive member that may be used with the present invention, as a replacement for the aforedefined solder ball 33. Each of these embodiments comprises an electrically conductive pin which is soldered to the underlying conductive pad (which is shown in a much smaller scale in FIG. 5 for illustration purposes). It is understood that the conductive pad 13' (represented by the numeral 13 in FIGS. 5–8) may be of any of the configurations depicted in FIGS. 2A–4A for all of the pinned embodiments defined herein. Substrate 11', including the desired underlying conductive layer (represented by 15" in FIGS. 5–8) is also shown. Although the numeral 15" is used, it is understood that the underlying conductive layer may assume any of the configurations described hereinabove and shown in FIGS. 2A–4A. Only part of this underlying layer is shown, for ease of illustration.

Figure 5:
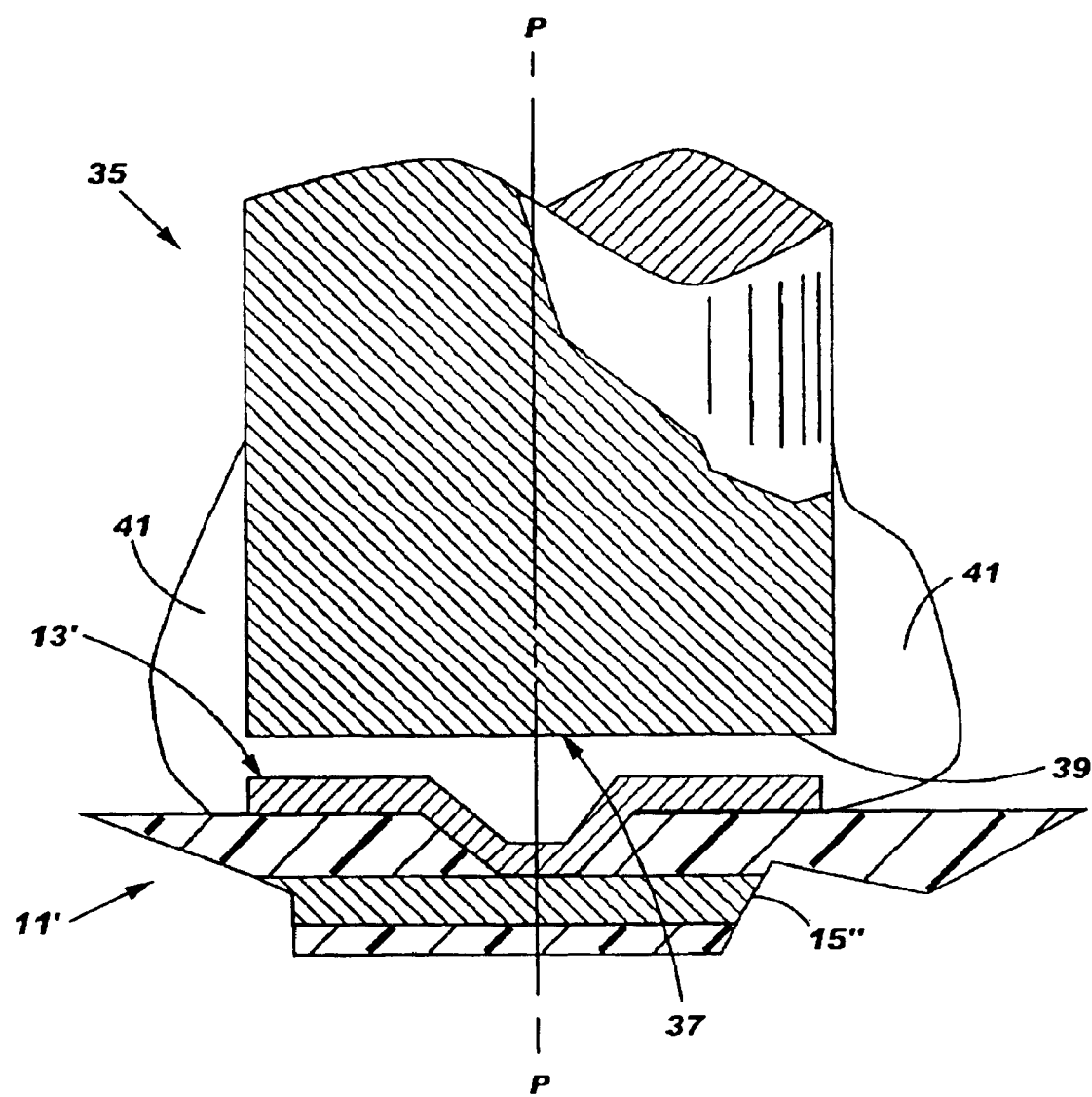
FIGS. 5–8 illustrate various embodiments of electrically conductive pins usable in the present invention.

In FIG. 5, pin 35 is of substantially cylindrical configuration and includes an engaging portion 37 for aligning with and being electrically coupled to conductive pad 13'. In FIG. 5, this engaging portion includes a substantially planar end surface 39 which, as shown, lies substantially parallel to the upper, planar portion of pad 13'. The solder used to couple pin 35 is represented by the numeral 41. In addition to lying between surface 39 and the upper surface of pad 13', solder 41 also wicks up the side of pin 35 to provide added strength at this jointure.

Figure 6:
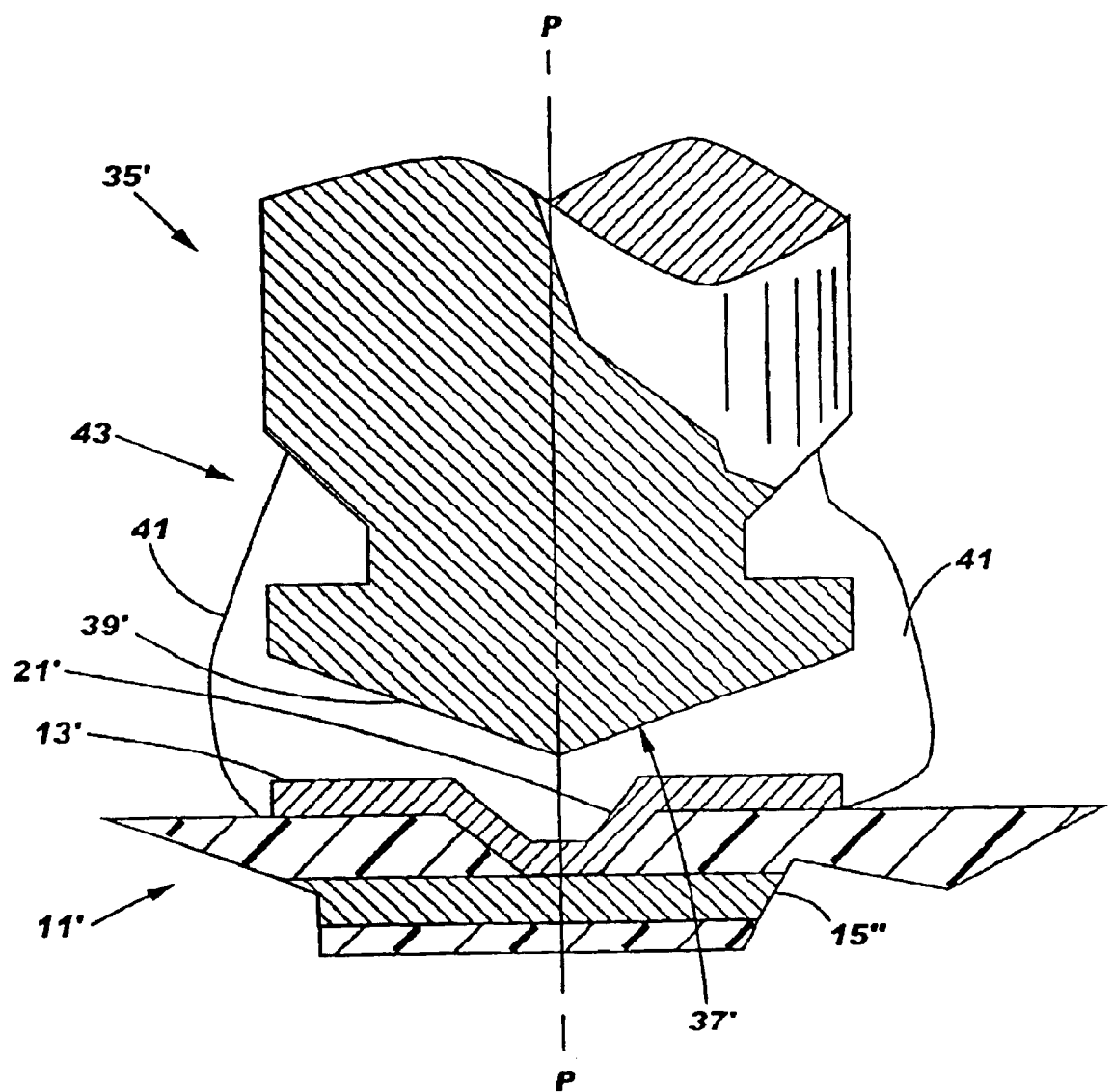

In FIG. 6, pin 35' includes the aforementioned engaging portion 37' but further includes an indented portion 41 located at a spaced distance from engaging portion 37'. This recessed portion 43 is designed for having the solder 41 which wicks up along the pin to extend within the recessed portion to thus add even further strength to this coupling. In the embodiment of FIG. 6, the engaging portion 37' of pin 35 includes a tapered surface 39' which tapers to a point that is substantially centrally oriented above the indented via portion of conductor 13'. That is, the central axis of pin 35' extends through this point and also substantially through the center of the bottom of the annular surface of the indented portion (represented by the numeral 21'). (This is also true for the axis of cylindrical pin 35 in FIG. 5.) The axes of the pins shown herein are represented by the line P—P.

Figure 7:
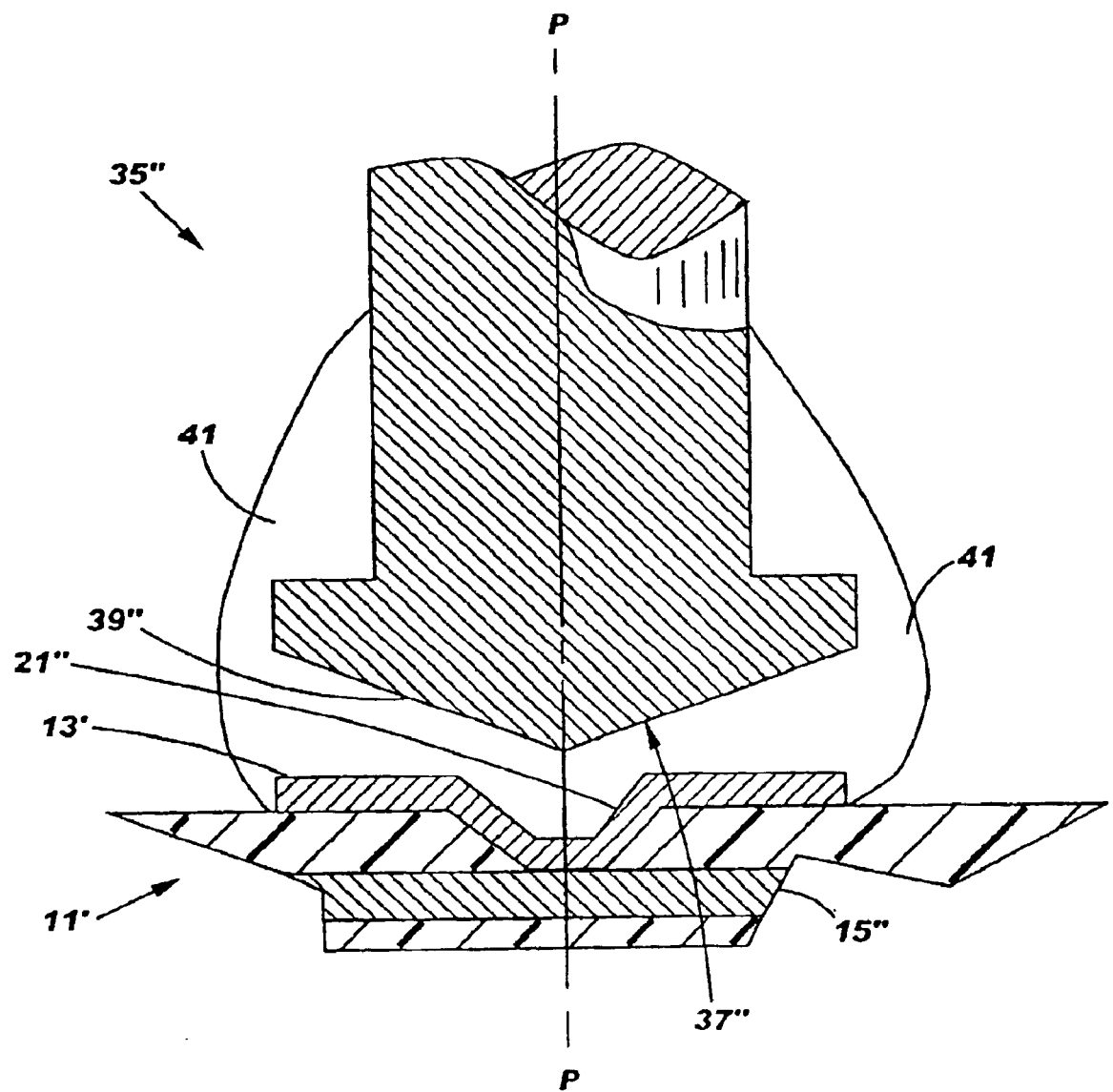

In FIG. 7, pin 35" includes a cylindrical portion and a forward engaging portion 37" having a tapered surface 39" substantially similar to that in FIG. 6. In FIG. 7, however, there is no recessed portion similar to portion 43 in FIG. 6 due to the continual extension of the cylindrical body of the pin. The projecting ends of portion 37", however, serve to capture wicking solder 41 thereabove and thus provide the additional needed strength for this connection.

Figure 8:
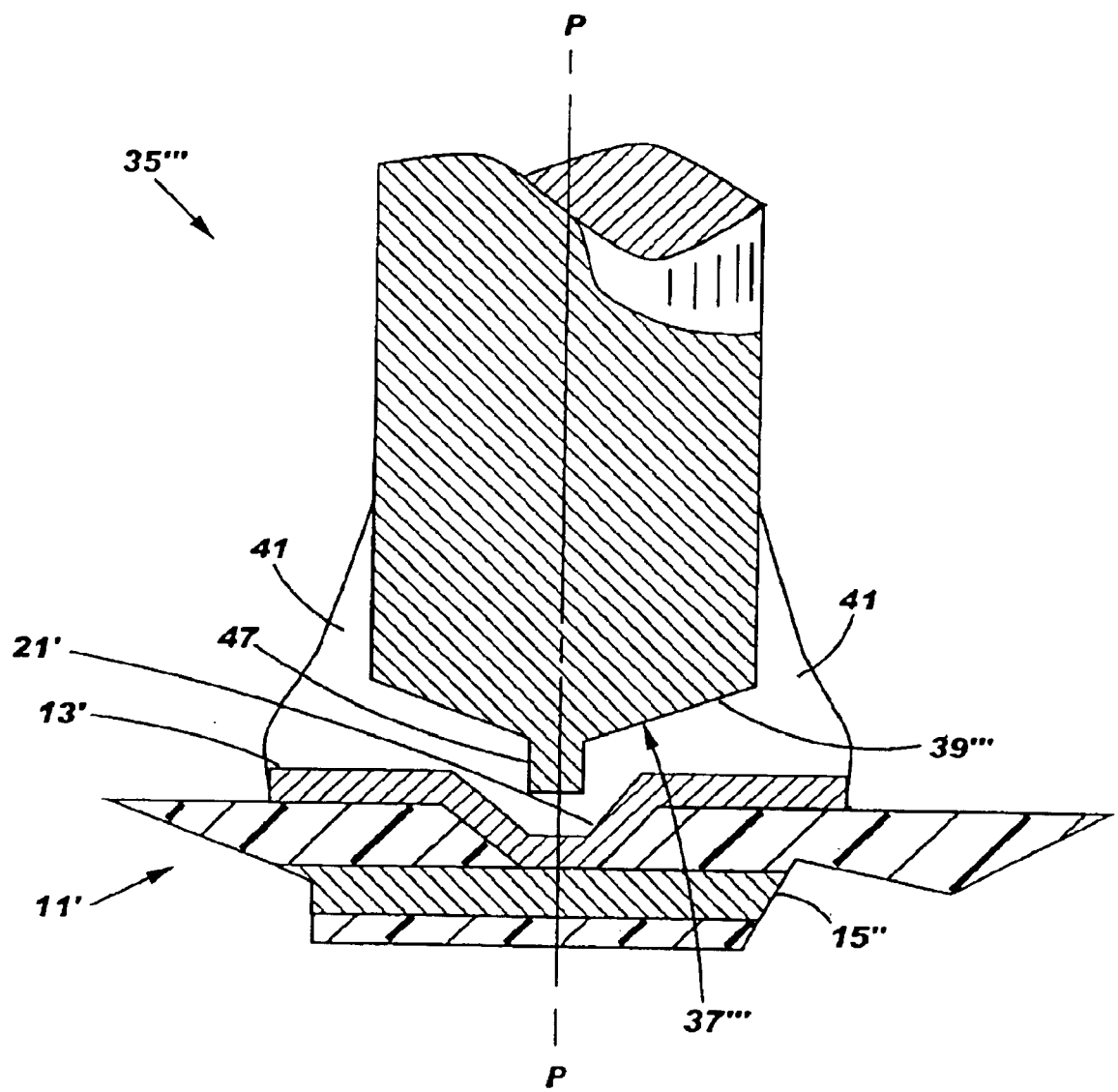

In FIG. 8, pin 35''' includes the elongated cylindrical body as in FIG. 7 and terminates in an engaging portion 37''' having a substantially tapered end surface 39'''. Additionally, however, this end surface includes a projection portion 47 which, in one embodiment, is substantially cylindrical and centrally located along the pin's axis P—P. Projection portion 47 also is seen to extend within the recess defined by the indented via 21'.

Figure 9:
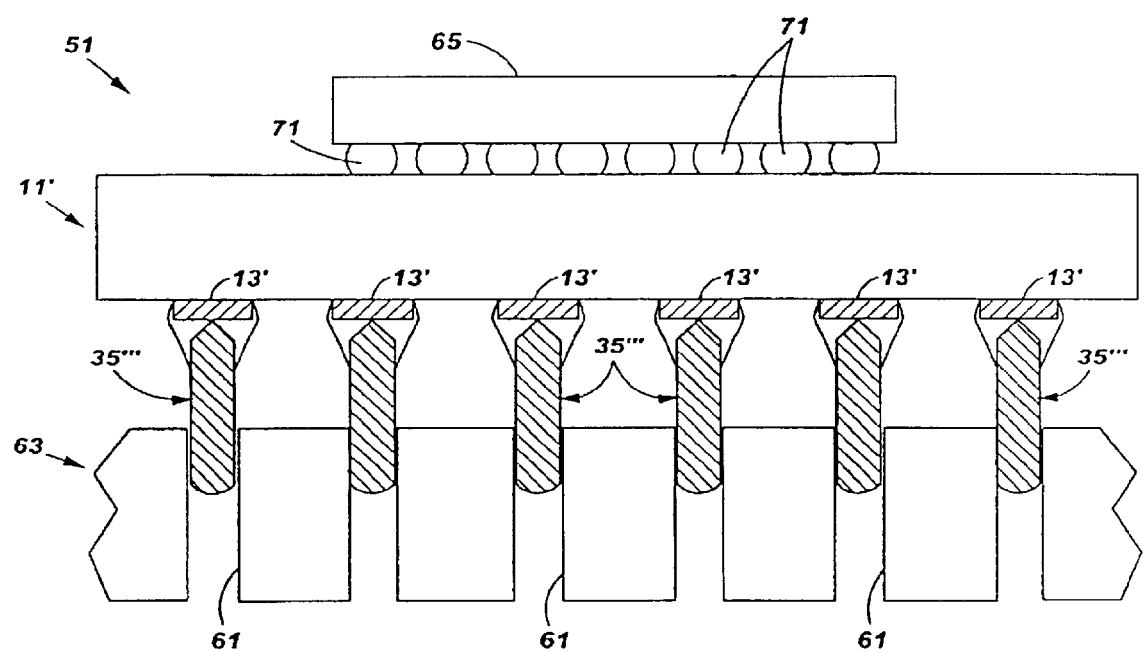
FIG. 9 illustrates a side elevational view of an electronic package according to one embodiment of the invention, the package being electrically coupled to a host substrate such as a printed circuit board.

In FIG. 9, there is shown an electrically assembly 51 which includes an electronic package having a substrate 11' and a plurality of pins 35''' secured thereto in accordance with the teachings of the invention. Pins 35''' are meant to be similar to those in FIG. 8 with the exception that the projection portion 47 of each is not shown for ease of illustration. Additionally, the conductive pads 13' are only shown as planar pads and without the necessary indented vias therein, again for ease of illustration. It is understood that such vias are required in each pad, whether a singular one only or a plurality thereof such as depicted in FIGS. 3A and 4A. It is also understood that any of the pins depicted herein may be utilized in place of pins 35'''. Pins 35''' are, as described, soldered to the respective pads 13'. Each pin in turn is inserted within a conductive receptor 61 of a printed circuit board 63 or similar conductive substrate. The desired receptive portions 61 are preferably plated through holes as are known in the art and further description is not believed necessary. Understandably, each pin is electrically coupled to the conductive plating of such a through hole and in turn coupled to respective internal layers within the usually multilayered printed circuit board. The assembly of FIG. 9 further includes a semiconductor chip 65 positioned on an opposite side of substrate 11 (and thus electrically coupled to opposing conductors on the substrate's opposite surface, one example being shown as the lower conductor in FIGS. 2A, 3A and 4A). These conductors are not shown in FIG. 9 for ease of illustration. The semiconductor chip 65 is coupled to these respective conductors by a plurality of solder balls 71 in a manner known in the art. Such a connection is referred to the industry as a flip-chip connection wherein the conductive sites (not shown) of the chip are directly coupled to corresponding conductive elements on a receiving substrate (such as the organic laminate substrate 11' of the invention) to thus avoid the use of wirebonding or the like which requires additional substrate real estate.

In the embodiment of FIG. 9, it is also possible to substitute solder balls for pins 35''' and use these to couple the respective pads 13' to corresponding pads (receptors) on the board's facing surface. Such a solder ball is shown in FIG. 4A and would clearly be electrically coupled to a corresponding pad (not shown) on the upper surface, the pad typically of planar configuration and well-known in the art.

Figure 10:
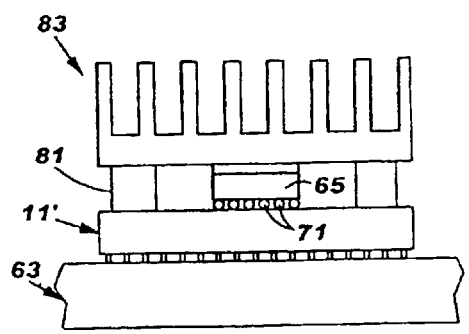
FIG. 10 is a side elevational view, on a reduced scale over that of FIG. 9, showing an electronic package and circuit board assembly, further including additional components (i.e., heat sink)

In FIG. 10, there is shown an electronic package and receiving printed circuit board assembly according to one embodiment of the invention. The package includes the substrate 11' as described above, chip 65 coupled thereto with solder balls 71, a reinforcing member 81 which is positioned on the upper surface of substrate 11', and a heat sink 83 which is bonded to chip 65 and the reinforcing member 81' to serve as a means for heat escape from chip 65 during package operation. Substrate 11' is pinned to circuit board 63 similarly to the embodiment shown in FIG. 9.

Figure 11:
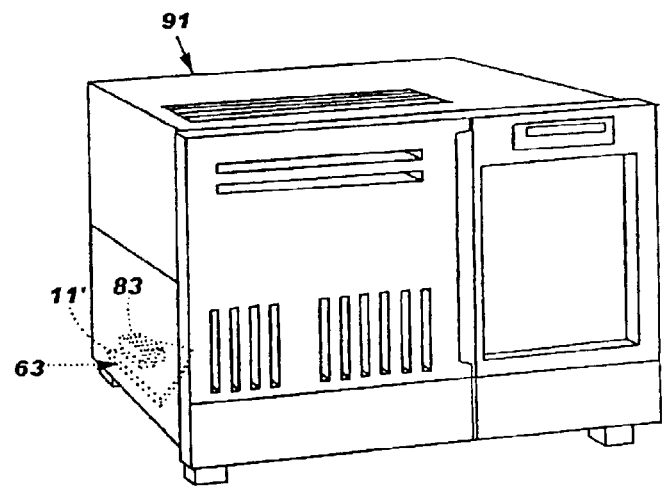
FIG. 11 is a perspective view of an information handling system according to one embodiment of the invention, the system including a package-board subassembly of the type depicted in FIG. 10.

In FIG. 11, there is shown an information handling system 91 according to one aspect of the invention. System 91 may include a computer, server, mainframe or other large information processing structure and, as shown in FIG. 11, includes at least one circuit board and electronic package of the present invention therein. More than one such assembly may be utilized in an information handling system of this type and the invention is not limited to use of only one, as shown.

Thus there has been shown and described an electronic package and associated information handling system wherein a unique aspect of the package is the utilization of either solder balls or pins to couple the package's substrate to a corresponding receiving substrate to form a larger assembly. Significantly, this feature is attainable by the use of an underlying, internal electrically conductive layer which couples to the substrate's external pad(s) to reinforce adhesion of the pad and prevent cracking or separation thereof during the stresses encountered during package operation, or other handling (including during transportation or manufacturing). This represents a significant advancement in the art.

While there have been shown and described what are at present the preferred embodiment of the invention, it will be obvious to those skilled in the art that various changes and modifications may be made therein without departing from the scope of the invention as defined by the appended claims.

What is claimed is:

1. An electronic package comprising:

an organic laminate substrate having an external surface;

an electrically conductive pad positioned on said external surface of said organic laminate substrate; and at least one electrically conductive layer positioned within said organic laminate substrate and physically coupled to said electrically conductive pad, said at least one electrically conductive layer of a size sufficiently large enough to substantially prevent removal of said electrically conductive pad when said pad is subjected to a tensile pressure of at least about 1.4 grams per square mil.

2. The package of claim 1 wherein said organic laminate substrate includes a plurality of layers of dielectric material and a plurality of electrically conductive layers in addition to said at least one electrically conductive layer.

3. The package of claim 1 wherein said at least one electrically conductive layer is positioned within said organic laminate substrate substantially beneath said electrically conductive pad.

4. An electronic package comprising:

a substrate having an external surface;

an electrically conductive pad positioned on said external surface and including a first substantially planar portion and at least one indented via portion; and at least one electrically conductive layer positioned within said substrate and physically coupled to said electrically conductive pad, said at least one electrically conductive layer of a size sufficiently large enough to substantially prevent removal of said electrically conductive pad when said pad is subjected to a tensile pressure of at least about 1.4 grams per square mil, said at least one indented via portion of said electrically conductive pad being physically coupled to said at least one electrically conductive layer.

5. The package of claim 4 wherein the number of said indented via portions is two or greater.

6. The package of claim 5 wherein the number of said indented vias is three, said indented vias substantially uniformly positioned in a substantially annular orientation on said first substantially planar portion.

7. An electronic package comprising:

a substrate having an external surface;

an electrically conductive pad positioned on said external surface; and at least one electrically conductive layer positioned within said substrate and physically coupled to said electrically conductive pad, said at least one electrically conductive layer of a size sufficiently large enough to substantially prevent removal of said electrically conductive pad when said pad is subjected to a tensile pressure of at least about 1.4 grams per square mil, the surface area of said at least one electrically conductive layer exceeding by at least 25 percent the surface area of said electrically conductive pad.

8. An electronic package comprising:

a substrate having an external surface;

an electrically conductive pad positioned on said external surface;

at least one electrically conductive layer positioned within said substrate and physically coupled to said electrically conductive pad, said at least one electrically conductive layer of a size sufficiently large enough to substantially prevent removal of said electrically conductive pad when said pad is subjected to a tensile pressure of at least about 1.4 grams per square mil; and an electrically conductive member secured to said electrically conductive pad for connecting said pad to an external electrically conductive structure, said electrically conductive member comprising a solder ball.

9. An electronic package comprising:

a substrate having an external surface;

an electrically conductive pad positioned on said external surface;

at least one electrically conductive layer positioned within said substrate and physically coupled to said electrically conductive pad, said at least one electrically conductive layer of a size sufficiently large enough to substantially prevent removal of said electrically conductive pad when said pad is subjected to a tensile pressure of at least about 1.4 grams per square mil; and an electrically conductive member secured to said electrically conductive pad for connecting said pad to an external electrically conductive structure, said electrically conductive member comprising a pin, said pin being soldered to said electrically conductive pad to secure said pin thereto.

10. The package of claim 9 wherein said pin comprises an engaging portion and a recessed portion spacedly positioned from said engaging portion, said solder securing said pin to said electrically conductive pad extending within said recessed portion.

11. An information handling system comprising:

at least one printed circuit board including at least one electrically conductive receptor thereon;

an electronic package including a substrate having an external surface, an electrically conductive pad positioned on said external surface, and at least one electrically conductive layer positioned within said substrate and physically coupled to said electrically conductive pad, said at least one electrically conductive layer of a size sufficiently large enough to substantially prevent removal of said electrically conductive pad when said pad is subjected to a tensile pressure of at least about 1.4 grams per square mil; and an electrically conductive member secured to said electrically conductive pad and electrically coupled to said at least one electrically conductive receptor to connect said electronic package to said at least one printed circuit board, said electrically conductive receptor comprising a pad and said electrically conductive member comprising a solder element.

12. The information handling system of claim 11 wherein said solder element comprises a solder ball.

13. An information handling system comprising:

at least one printed circuit board including at least one electrically conductive receptor thereon;

an electronic package including a substrate having an external surface, an electrically conductive pad positioned on said external surface, and at least one electrically conductive layer positioned within said substrate and physically coupled to said electrically conductive pad, said at least one electrically conductive layer of a size sufficiently large enough to substantially prevent removal of said electrically conductive pad when said pad is subjected to a tensile pressure of at least about 1.4 grams per square mil; and an electrically conductive member secured to said electrically conductive pad and electrically coupled to said at least one electrically conductive receptor to connect said electronic package to said at least one printed circuit board, said at least one electrically conductive receptor comprising a conductive opening and said electrically conductive member comprising a pin.

14. An information handling system comprising:

at least one printed circuit board including at least one electrically conductive receptor thereon;

an electronic package including a substrate having an external surface, an electrically conductive pad positioned on said external surface, and at least one electrically conductive layer positioned within said substrate and physically coupled to said electrically conductive pad, said at least one electrically conductive layer of a size sufficiently large enough to substantially prevent removal of said electrically conductive pad when said pad is subjected to a tensile pressure of at least about 1.4 grams per square mil;

an electrically conductive member secured to said electrically conductive pad and electrically coupled to said at least one electrically conductive receptor to connect said electronic package to said at least one printed circuit board; and at least one semiconductor chip positioned on said substrate of said electronic package and electrically coupled to said substrate.

15. An information handling system comprising:

at least one printed circuit board including at least one electrically conductive receptor thereon;

an electronic package including an organic laminate substrate having an external surface, an electrically conductive pad positioned on said external surface, and at least one electrically conductive layer positioned within said organic laminate substrate and physically coupled to said electrically conductive pad, said at least one electrically conductive layer of a size sufficiently large enough to substantially prevent removal of said electrically conductive pad when said pad is subjected to a tensile pressure of at least about 1.4 grams per square mil; and an electrically conductive member secured to said electrically conductive pad and electrically coupled to said at least one electrically conductive receptor to connect said electronic package to said at least one printed circuit board.

16. An information handling system comprising:

at least one printed circuit board including at least one electrically conductive receptor thereon;

an electronic package including a substrate having an external surface, an electrically conductive pad positioned on said external surface, and at least one electrically conductive layer positioned within said substrate and physically coupled to said electrically conductive pad, said at least one electrically conductive layer of a size sufficiently large enough to substantially prevent removal of said electrically conductive pad when said pad is subjected to a tensile pressure of at least about 1.4 grams per square mil, said substrate further including a plurality of layers of dielectric material and a plurality of electrically conductive layers in addition to said at least one electrically conductive layer; and an electrically conductive member secured to said electrically conductive pad and electrically coupled to said at least one electrically conductive receptor to connect said electronic package to said at least one printed circuit board.

17. An information handling system comprising:

at least one printed circuit board including at least one electrically conductive receptor thereon;

an electronic package including a substrate having an external surface, an electrically conductive pad positioned on said external surface, and at least one electrically conductive layer positioned within said substrate and physically coupled to said electrically conductive pad, said at least one electrically conductive layer of a size sufficiently large enough to substantially prevent removal of said electrically conductive pad when said pad is subjected to a tensile pressure of at least about 1.4 grams per square mil; and an electrically conductive member secured to said electrically conductive pad and electrically coupled to said at least one electrically conductive receptor to connect said electronic package to said at least one printed circuit board, said information handling system selected from the group consisting of a personal computer, server and mainframe.

* * * * *

UNITED STATES PATENT AND TRADEMARK OFFICE
CERTIFICATE OF CORRECTION

PATENT NO. : 6,815,837 B2
DATED : November 9, 2004
INVENTOR(S) : D. Alcoe

It is certified that error appears in the above-identified patent and that said Letters Patent is hereby corrected as shown below:

Column 10,
Lines 55-65, delete
"an electronic package including a substrate having an
external surface,
an electrically conductive pad positioned on said external
surface, and at least one electrically conductive layer positioned within said
substrate and physically coupled to said electrically conductive pad, said at least
one electrically conductive layer of a size sufficiently large enough to
substantially prevent removal of said electrically conductive pad when said pad is
subjected to a tensile pressure of at least about 1.4 grams per square mil; and" and
insert
-- an electronic package including a substrate having an
external surface, an electrically conductive pad positioned on said external
surface, and at least one electrically conductive layer positioned within said
substrate and physically coupled to said electrically conductive pad, said at least
one electrically conductive layer of a size sufficiently large enough to
substantially prevent removal of said electrically conductive pad when said pad is
subjected to a tensile pressure of at least about 1.4 grams per square mil; and --.

Signed and Sealed this

Twenty-second Day of November, 2005

JON W. DUDAS
*Director of the United States Patent and Trademark Office*